US012456608B2

(12) United States Patent
Zhao

(10) Patent No.: US 12,456,608 B2
(45) Date of Patent: Oct. 28, 2025

(54) METHOD OF PROCESSING WAFER

(71) Applicant: DISCO CORPORATION, Tokyo (JP)

(72) Inventor: Yu Zhao, Tokyo (JP)

(73) Assignee: DISCO CORPORATION, Tokyo (JP)

(*) Notice: Subject to any disclaimer, the term of this patent is extended or adjusted under 35 U.S.C. 154(b) by 376 days.

(21) Appl. No.: 18/335,509

(22) Filed: Jun. 15, 2023

(65) Prior Publication Data
US 2023/0420221 A1 Dec. 28, 2023

(30) Foreign Application Priority Data
Jun. 27, 2022 (JP) .................. 2022-102807

(51) Int. Cl.
*H01L 21/306* (2006.01)
*B23K 26/364* (2014.01)
*H01J 37/32* (2006.01)
*H01L 21/3065* (2006.01)
*H01L 21/78* (2006.01)

(52) U.S. Cl.
CPC .... *H01J 37/32394* (2013.01); *H01L 21/3065* (2013.01); *H01L 21/78* (2013.01); *H01J 2237/334* (2013.01)

(58) Field of Classification Search
CPC ............. H01L 21/3065; H01L 21/78; H01L 21/02057; H01L 21/30655; H01L 21/3043; H01J 37/32394; H01J 2237/334; B23K 26/364
See application file for complete search history.

(56) References Cited

U.S. PATENT DOCUMENTS

| | | | |
|---|---|---|---|
| 2006/0105544 A1* | 5/2006 | Takanashi | H01L 21/67092 438/460 |
| 2009/0283127 A1* | 11/2009 | Juso | H10F 10/144 136/244 |
| 2012/0322238 A1* | 12/2012 | Lei | H01L 21/3065 257/E21.602 |
| 2012/0322240 A1* | 12/2012 | Holden | B23K 26/364 257/E21.602 |
| 2015/0104930 A1* | 4/2015 | Aikawa | H01L 21/268 438/462 |
| 2018/0166282 A1* | 6/2018 | Tabuchi | H01L 21/268 |
| 2020/0185227 A1* | 6/2020 | Wakahara | H01L 21/78 |
| 2024/0395621 A1* | 11/2024 | Lu | H01L 24/94 |

FOREIGN PATENT DOCUMENTS

| | | |
|---|---|---|
| JP | 2015079790 A | 4/2015 |
| JP | 2018098318 A | 6/2018 |

* cited by examiner

*Primary Examiner* — Omar F Mojaddedi
(74) *Attorney, Agent, or Firm* — GREER BURNS & CRAIN, LTD.

(57) ABSTRACT

A wafer has a substrate and a functional layer disposed on the substrate along a plurality of projected dicing lines. A method of processing the wafer includes applying a laser beam to the wafer along the projected dicing lines to remove portions of the functional layer, forming processed grooves in the functional layer through which the substrate is exposed, removing damaged regions produced in an interface between the substrate and the functional layer by the laser beam, and forming recesses extending outwardly from side surfaces of the processed grooves, a recess exposing step of removing portions of the functional layer that overhang the recesses, thereby exposing the recesses, and processing the substrate along the projected dicing line after the recess exposing step has been carried out.

4 Claims, 3 Drawing Sheets

METHOD OF PROCESSING WAFER

BACKGROUND OF THE INVENTION

Field of the Invention

The present invention relates to a method of processing a wafer.

Description of the Related Art

For processing a wafer having a substrate and a functional layer that includes an oxide film, a nitride film, a low-dielectric-constant insulative film (hereinafter referred to as a "low-k film"), and the like and that is disposed on the substrate along projected dicing lines established on the wafer, since the functional layer and the substrate need to be processed by different optimum processing methods, it has been customary to apply a laser beam to the wafer along the projected dicing lines to remove portions of the functional layer that are positioned along the projected dicing lines, and then process the substrate along the projected dicing lines to divide the wafer into device chips (see, for example, JP 2015-079790A and JP 2018-098318A).

SUMMARY OF THE INVENTION

However, it has been found that according to the process described above, after the laser beam has been applied to the wafer, a region of the substrate particularly in an interface between itself and the functional layer tends to become fragile due to effect of heat generated by the applied laser beam, resulting in modified damaged regions in the interface. If the wafer with the damaged regions left unremoved is divided into device chips, the device chips are likely to have their flexural strength lowered. One solution has been to remove the damaged regions, boring recesses in the interface between the substrate and the functional layer, after which the substrate is processed along the projected dicing lines. Specifically, when the damaged regions are removed from the interface between the substrate and the functional layer, the substrate is bored, making the recesses in the interface. However, since the functional layer overlies the recesses, difficulty arises in subsequently processing the substrate.

It is therefore an object of the present invention to provide a method of processing a wafer including a substrate and a functional layer disposed on the substrate, in a manner to prevent the flexural strength of device chips produced from the wafer from being lowered.

In accordance with an aspect of the present invention, there is provided a method of processing a wafer including a substrate and a functional layer disposed on the substrate along a plurality of projected dicing lines established on the wafer. The method includes a processed groove forming step of applying a laser beam to the wafer along the projected dicing lines to remove portions of the functional layer, and forming processed grooves in the functional layer through which the substrate is exposed, a damaged region removing step of removing damaged regions produced in an interface between the substrate and the functional layer in the processed groove forming step, and forming recesses extending outwardly from side surfaces of the processed grooves, a recess exposing step of removing portions of the functional layer that overhang the recesses, thereby exposing the recesses, and a substrate processing step of processing the substrate along the projected dicing line after the recess exposing step has been carried out.

Preferably, the substrate processing step includes covering side surfaces of the recesses from which the damaged regions have been removed and the side surfaces of the processed grooves with side surface protecting films and deepening bottoms of the processed grooves by way of plasma etching while preventing the recesses and the processed grooves from being enlarged horizontally.

Preferably, the recess exposing step is carried out by way of plasma etching.

Preferably, the method of processing a wafer further includes before the processed groove forming step is carried out, an upper surface protecting film forming step of forming an upper surface protecting film on the functional layer, in which the processed groove forming step includes the step of removing portions of the upper surface protecting film and the functional layer.

According to the present invention, when the wafer where the functional layer is disposed on the substrate is processed to produce a plurality of device chips, the flexural strength of the device chips is prevented from being lowered, which flexural strength would otherwise be lowered due to damaged regions in the substrate. The substrate where the processed grooves are deepened without the recesses being enlarged outwardly can be processed easily well.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will be described in detail hereinbelow with reference to the accompanying drawings. The present invention is not limited to the details of the embodiment described below. The components described below cover those which could easily be anticipated by those skilled in the art and those which are essentially identical to those described below. Furthermore, arrangements described below can be combined in appropriate manners. Various omissions, replacements, or changes of the arrangements may be made without departing from the scope of the present invention. In the description below, those components that are identical to each other are denoted by identical reference signs.

Figure 1:
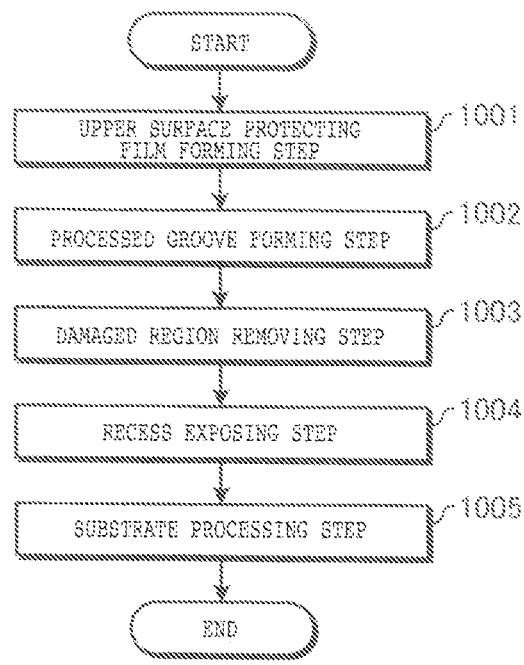
FIG. 1 is a flowchart of a processing sequence of a method of processing a wafer according to an embodiment of the present invention.

A method of processing a wafer, hereinafter also referred to as a "wafer processing method," according to the present embodiment will be described below. FIG. 1 is a flowchart of a processing sequence of the wafer processing method according to the present embodiment. As illustrated in FIG. 1, the wafer processing method according to the present embodiment includes upper surface protecting film forming step 1001, processed groove forming step 1002, damaged region removing step 1003, recess exposing step 1004, and substrate processing step 1005.

Figure 2:
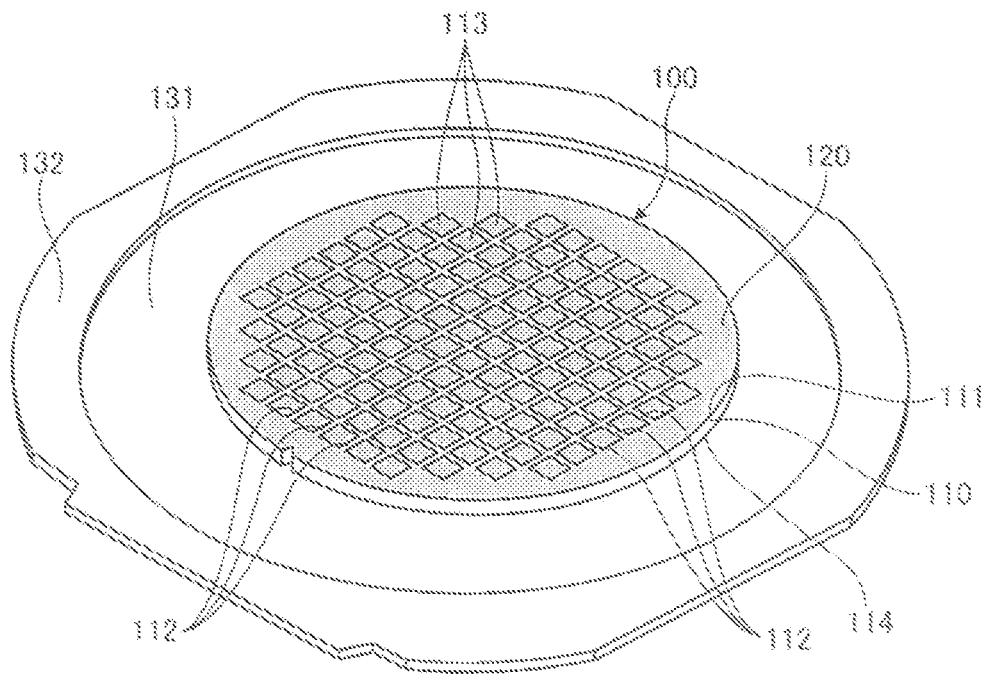
FIG. 2 is a perspective view of a wafer to be processed by the method of processing a wafer according to the embodiment.

FIG. 2 illustrates, in perspective, a wafer 100 to be processed by the wafer processing method according to the embodiment. As illustrated in FIG. 2, the wafer 100 includes a substrate 110 and a functional layer 120. The substrate 110 is a circular semiconductor wafer made of a base material of silicon, an optical device wafer, or the like. The material of the substrate 110 is not limited to silicon, and may instead be sapphire ($Al_2O_3$), silicon carbide (SiC), gallium arsenide (GaAs), or the like. The functional layer 20 includes a plurality of devices 113 constructed in respective areas demarcated by a grid of projected dicing lines 112 established thereon.

The functional layer 120 is disposed on a face side 111 of the substrate 110 as illustrated in FIG. 2. The face side 111 is illustrated as facing upwardly. The functional layer 120 includes an oxide film or a nitride film that is formed when the face side 111 of the substrate 110 is oxidized or nitride, a film of an inorganic material such as SiOF, borosilicate glass (BSG), SiOB, or the like, a low-dielectric-constant insulative film, i.e., a low-k film, in the form of an organic film such as a polymer film of polyimide or parylene. According to the present embodiment, the base material of the substrate 110 is silicon, and the functional layer 120 includes a silicon oxide film and a silicon nitride film. According to the present embodiment, as illustrated in FIG. 2, an adhesive tape 131 is affixed to a reverse side 114 of the substrate 110 that is opposite the face side 111 and hence faces downwardly, and an annular frame 132 is mounted on an outer edge portion of the adhesive tape 131. The wafer 100 thus assembled together with the adhesive tape 131 and the annular frame 132 will be handled as a wafer unit. According to the present invention, however, the wafer 100 is not limited to being combined with the adhesive tape 131 joined to the annular frame 132.

Upper surface protecting film forming step 1001 is a step of forming an upper surface protecting film 140 (see FIGS. 3 through 6) on the functional layer 120. In upper surface protecting film forming step 1001, the wafer 100 is held on a holding table, not illustrated, such that the adhesive tape 131 affixed to the reverse side 114 is interposed between the wafer 100 and the holding table, and the holding table is rotated about its central axis parallel to vertical directions, rotating the wafer 100 with the holding table. While the wafer 100 is being rotated, a resin supply nozzle, not illustrated, discharges a liquid resin onto the functional layer 120 of the wafer 100 on the holding table, coating the functional layer 120 with the liquid resin. The liquid resin applied to the functional layer 120 is dried into an upper surface protecting film 140 that protects an upper surface of the functional layer 120.

According to the present embodiment, the liquid resin applied to the functional layer 120 in upper surface protecting film forming step 1001 is, for example, polyvinyl alcohol (PVA), polyvinylpyrrolidone (PVP), or the like. The upper surface protecting film 140 formed in upper surface protecting film forming step 1001 prevents debris or swarf produced from the functional layer 120 in processed groove forming step 1002 from being deposited on the upper surface of the functional layer 120. According to the present embodiment, the upper surface protecting film 140 is formed as a water-soluble resin film in upper surface protecting film forming step 1001.

According to the present embodiment, the wafer processing method includes upper surface protecting film forming step 1001. The upper surface protecting film 140 formed in upper surface protecting film forming step 1001 is a preferable arrangement for preventing those portions of the functional layer 120 that lie on the upper surfaces of the devices 113 from being etched away in subsequent steps of the wafer processing method and hence from adversely affecting the devices 113. However, present invention is not limited to including upper surface protecting film forming step 1001 to form the upper surface protecting film 140. If debris produced from the functional layer 120 in processed groove forming step 1002 is small in amount, the deposition of debris on the surfaces of the devices 113 that face the functional layer 120 does not adversely affect the quality of the devices 113, or the devices 113 are not exposed even when the functional layer 120 is thinned down by plasma etching or the like, then the wafer processing method may not include upper surface protecting film forming step 1001. In other words, upper surface protecting film forming step 1001 is not an essential indispensable step according to the present invention. If the wafer processing method includes upper surface protecting film forming step 1001 according to the present embodiment, it is carried out before processed groove forming step 1002.

Figure 3:
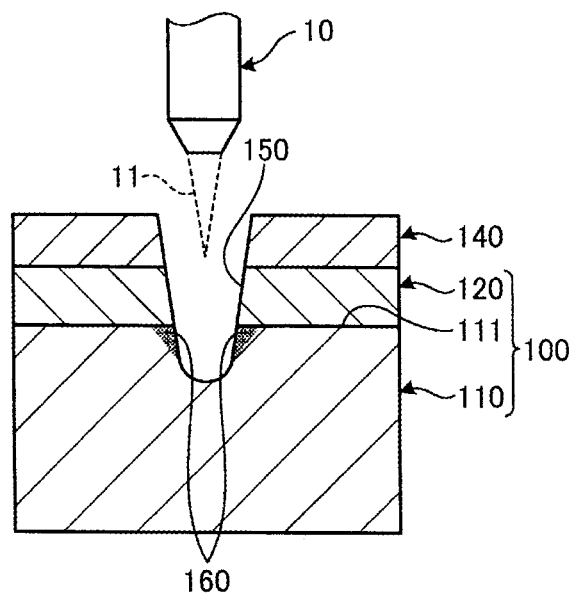
FIG. 3 is a cross-sectional view illustrating a processed groove forming step of the method illustrated in FIG. 1.

FIG. 3 illustrates, in cross section, processed groove forming step 1002 of the wafer processing method illustrated in FIG. 1. As illustrated in FIG. 3, processed groove forming step 1002 is a step of applying a laser beam 11 to the wafer 100 along each of the projected dicing lines 112 to remove a portion of the functional layer 120 along the projected dicing line 112, forming a processed groove 150 through which the substrate 110 is exposed. If the wafer processing method includes upper surface protecting film forming step 1001 according to the present embodiment, then processed groove forming step 1002 applies the laser beam 11 to the upper surface protecting film 140 formed in upper surface protecting film forming step 1001 as well as the functional layer 120 along the projected dicing line 112, removing portions of the upper surface protecting film 140 and the functional layer 120 along the projected dicing line 112.

In processed groove forming step 1002, as illustrated in FIG. 3, a laser beam applying unit 10 applies the laser beam 11 whose wavelength is absorbable by the upper surface protecting film 140 and the functional layer 120 to the surface of the wafer 100 where the functional layer 120 and the upper surface protecting film 140 are present. At the same time, the wafer 100 is moved relatively to the laser beam applying unit 10 along the projected dicing line 112 by an actuator, not illustrated, so that the laser beam 11 processes the upper surface protecting film 140 and the functional layer 120 along the projected dicing line 112 by way of ablation, removing the portions of the upper surface protecting film 140 and the functional layer 120 along the projected dicing line 112 to form the processed groove 150 to a depth going through the upper surface protecting film 140 and the functional layer 120 to the substrate 110. In processed groove forming step 1002, the processed groove 150 thus formed allows the substrate 110 to be exposed upwardly at the bottom of the processed groove 150.

In a plasma etching process to be performed later in substrate processing step 1005, the functional layer 120 that includes an oxide film or a nitride film according to the present embodiment has a lower processing rate or speed than the substrate 110 made of silicon according to the present embodiment. Therefore, it is preferable to remove the functional layer 120 earlier in processed groove forming step 1002. In processed groove forming step 1002, the region of the substrate 110 near the interface between the substrate 110 and the functional layer 120, i.e., near the face side 111 of the substrate 110, contains damaged regions 160 including minuscule cracks and low-strength modified layers that extend outwardly from the side surfaces of the processed groove 150, due to thermal damage caused by the applied laser beam 11.

Figure 4:
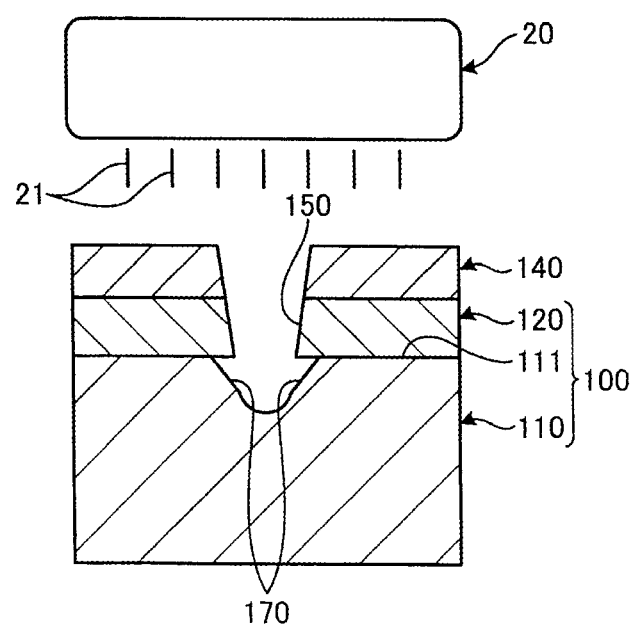
FIG. 4 is a cross-sectional view illustrating a damaged region removing step of the method illustrated in FIG. 1.

FIG. 4 illustrates, in cross section, damaged region removing step 1003 of the wafer processing method illustrated in FIG. 1. As illustrated in FIG. 4, damaged region removing step 1003 is a step of removing the damaged regions 160 formed in the interface between the substrate 110 and the functional layer 120 in processed groove forming step 1002, forming recesses 170 extending outwardly from the side surfaces of the processed groove 150.

In damaged region removing step 1003, as illustrated in FIG. 4, after processed groove forming step 1002 has been carried out, a plasma etching process is carried out by supplying a first plasma gas 21 from a plasma gas supply unit 20 to the surface of the wafer 100 where the functional layer 120 and the upper surface protecting film 140 are present. The first plasma gas 21 is a gas that mainly reacts with the substrate 110 and is less liable to react with the functional layer 120. According to the present embodiment, inasmuch as the substrate 110 is made of silicon and the functional layer 120 includes a silicon oxide film or a silicon nitride film, the first plasma gas 21 is a fluorine (F)-based radical gas, for example. According to the present embodiment, specifically, a sulfur hexafluoride ($SF_6$) is used as the first plasma gas 21, for example. In damaged region removing step 1003, isotropic etching is performed by the first plasma gas 21.

In damaged region removing step 1003, the first plasma gas 21 mainly etches the substrate 110, particularly the damaged regions 160 thereof, while leaving the functional layer 120 essentially unetched, forming recesses 170 in the damaged regions 160 in a manner to replace the damaged regions 160. By thus removing the damaged regions 160 in damaged region removing step 1003, the flexural strength of device chips including the respective devices 113 and produced by dividing the wafer 100 along the projected dicing lines 112 is prevented from being lowered. After damaged region removing step 1003 has been carried out, as illustrated in FIG. 4, the functional layer 120 has portions overhanging the recesses 170 outwardly from the side surfaces of the processed groove 150.

Figure 5:
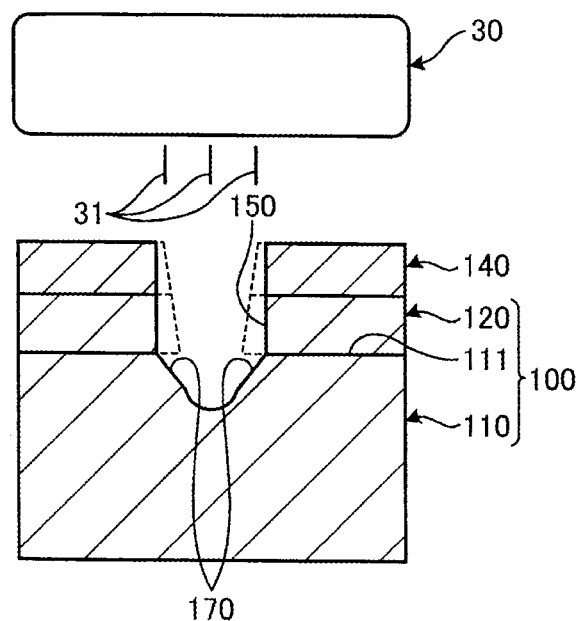
FIG. 5 is a cross-sectional view illustrating a recess exposing step of the method illustrated in FIG. 1.

FIG. 5 illustrates, in cross section, recess exposing step 1004 of the wafer processing method illustrated in FIG. 1. As illustrated in FIG. 5, recess exposing step 1004 is a step of removing the portions of the functional layer 120 that overhang the recesses 170, exposing the recesses 170, after damaged region removing step 1003 has been carried out.

In recess exposing step 1004, as illustrated in FIG. 5, a plasma etching process is carried out by supplying a second plasma gas 31 from a plasma gas supply unit 30 thicknesswise of the wafer 100 to the portions of the functional layer 120 and the upper surface protecting film 140 that overhang the recesses 170 on the surface of the wafer 100 where the functional layer 120 and the upper surface protecting film 140 are present. The second plasma gas 31 is a gas that mainly reacts with the functional layer 120 and is less liable to react with the substrate 110. According to the present embodiment, inasmuch as the substrate 110 is made of silicon and the functional layer 120 includes a silicon oxide film or a silicon nitride film, the second plasma gas 31 is a fluorocarbon (CF)-based radical gas or a mixture of CF-based radical gas and rare gas, oxygen, or the like, for example. According to the present embodiment, specifically, a mixture of octafluorocyclobutane ($C_4F_8$) and argon is used as the second plasma gas 31, for example. In recess exposing step 1004, anisotropic etching is performed by the second plasma gas 31.

In recess exposing step 1004, the second plasma gas 31 mainly reacts with the functional layer 120 overhanging the recess while leaving the substrate 110 essentially unetched, removing the portions of the functional layer 120 and the upper surface protecting film 140 that overhang the recesses 170 to expose the recesses 170 upwardly thicknesswise of the wafer 100.

According to the present embodiment, the plasma etching process is carried out in recess exposing step 1004 as described above. However, the present invention is not limited to carrying out the plasma etching process in recess exposing step 1004. According to the present invention, a laser beam having a wavelength absorbable by the functional layer 120 may be applied to the portions of the functional layer 120 and the upper surface protecting film 140 that overhang the recesses 170 to remove those portions of the functional layer 120 and the upper surface protecting film 140 by way of ablation, or a rotating cutting blade mounted on the distal end of a spindle may be used to cut off the portions of the functional layer 120 and the upper surface protecting film 140 that overhang the recesses 170.

Figure 6:
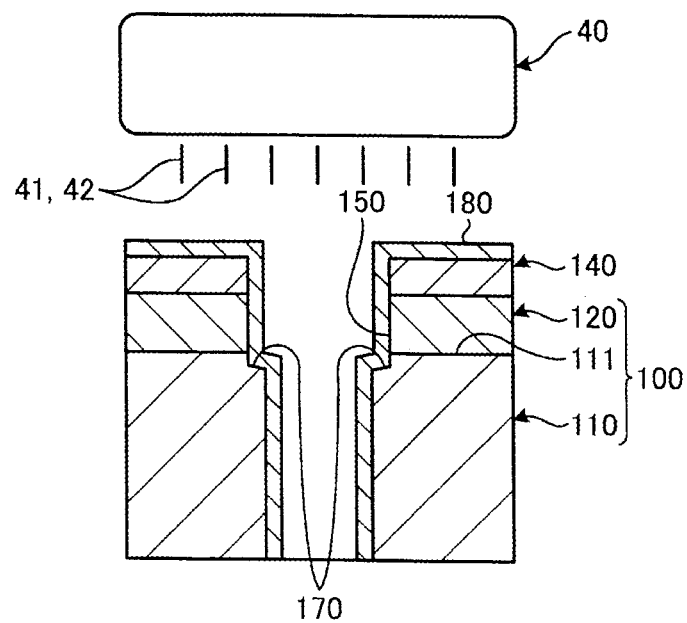
FIG. 6 is a cross-sectional view illustrating a substrate processing step of the method illustrated in FIG. 1.

FIG. 6 illustrates, in cross section, substrate processing step 1005 of the wafer processing method illustrated in FIG. 1. As illustrated in FIG. 6, substrate processing step 1005 is a step of processing the substrate 110 along the projected dicing line 112 after recess exposing step 1004 has been carried out.

In substrate processing step 1005, according to the present embodiment, a film depositing process is carried out to cover the side surfaces of the recesses 170 from which the damaged regions 160 have been removed and the side surfaces of the processed groove 150 with a side surface protecting film 180 that is different from the upper surface protecting film 140, and a plasma etching process is carried out to progressively deepen the bottom of the processed groove 150 while preventing the recesses 170 and the processed groove 150 from being enlarged horizontally, i.e., sideways of or outwardly from the recesses 170 and the processed groove 150. Specifically, substrate processing step 1005 includes a side surface protecting film depositing step of covering the side surfaces of the recesses 170 and the side surfaces of the processed groove 150 with the side surface protecting film 180 and a deepening step of progressively deepening the bottom of the processed groove 150 downwardly thicknesswise of the wafer 100 by way of plasma etching.

As illustrated in FIG. 6, the side surface protecting film depositing step is a step of supplying a third plasma gas 41 from a plasma gas supply unit 40 to the surface of the wafer 100 where the functional layer 120 and the upper surface protecting film 140 are present to deposit the side surface protecting film 180 on the upper surface of the upper surface protecting film 140 as an exposed surface of the wafer 100, the side surfaces of the recesses 170 and the processed groove 150, and the bottom surfaces of the recesses 170 and the processed groove 150. The side surface protecting film 180 is a deposited film of the components of the third plasma gas 41 and protects the side surfaces of the recesses 170 and the processed groove 150 against being enlarged horizontally by way of plasma etching.

According to the present embodiment, the third plasma gas 41 supplied in the side surface protecting film depositing step is a gas for forming a polymer-based protecting film including a CF-based radical gas, for example. According to the present embodiment, specifically, a mixture of $C_4F_8$ and argon is used as the third plasma gas 41. The third plasma gas 41 has its ionic state, its ratio of argon to $C_4F_8$, the pressure in a chamber supplied with the third plasma gas 41, etc., changed from those of the second plasma gas 31 whose components are similar to the third plasma gas 41, thereby depositing the side surface protecting film 180, rather than removing the functional layer 120 and the upper surface protecting film 140. According to the present embodiment, the side surface protecting film depositing step forms a deposited film of the components of the CF-based radical gas as the side surface protecting film 180.

As illustrated in FIG. 6, the deepening step is a step of, after side surface protecting film 180 has been deposited in the side surface protecting film depositing step, supplying a fourth plasma gas 42 from the plasma gas supply unit 40 to the surface of the wafer 100 where the functional layer 120 and the upper surface protecting film 140 are present, removing the side surface protecting film 180 deposited on the bottom of the processed groove 150 in the wafer 100, and performing plasma etching on the substrate 110 at the bottom of the processed groove 150 to thereby deepen the processed groove 150 in the substrate 110.

According to the present embodiment, the fourth plasma gas 42 supplied in the deepening step is similar to the first plasma gas 21, or specifically $SF_6$ as an F-based radical gas, for example. In the deepening step, therefore, the fourth plasma gas 41 mainly reacts with the substrate 110, etching away the substrate 110 at the bottom of the processed groove 150 to deepen the processed groove 150 in the substrate 110.

In substrate processing step 1005, according to the present embodiment, the side surface protecting film depositing step and the deepening step are alternately carried out repeatedly as separate steps in the generally-called Bosch process to form the processed groove 150 that has a high aspect ratio by etching the side surfaces of the processed groove 150 at an etching rate much lower than the bottom thereof. However, the present invention is not limited to the above details of substrate processing step 1005. Rather, the side surface protecting film depositing step and the deepening step may be carried out concurrently to form the processed groove 150 that has a high aspect ratio.

The CF-based radicals contained in the third plasma gas 41 supplied in the side surface protecting film depositing step to deposit the side surface protecting film 180 have larger molecules than the F-based radicals contained in the fourth plasma gas 42 supplied in the deepening step to deepen the bottom of the processed groove 150. Consequently, when the functional layer 120 overhangs the recesses 170, the CF-based radicals supplied in the side surface protecting film depositing step are not likely to reach the recesses 170 and to deposit the side surface protecting film 180, while the F-based radials supplied in the deepening step are liable to reach the recesses 170 and to enlarge the recesses 170 outwardly. If the F-based radicals reach the recesses 170 and enlarge the recesses 170 outwardly, the interface between the substrate 110 and the functional layer 120 becomes fragile, possibly resulting in a reduction in the flexural strength of device chips including the respective devices 113 and produced by dividing the wafer 100 along the projected dicing lines 112.

According to the present embodiment, however, after the portions of the functional layer 120 and the upper surface protecting film 140 that overhang the recesses 170 have been removed, exposing the recesses 170 upwardly to leave them uncovered with the functional layer 120 in recess exposing step 1004, substrate processing step 1005 is carried out. Therefore, the side surface protecting film 180 deposited in side surface protecting film depositing step is liable to be deposited in the recesses 170, i.e., on the side surfaces of the processed groove 150 near the interface between the substrate 110 and the functional layer 120. According to the present embodiment, the recesses 170, i.e., the side surfaces of the processed groove 150 near the interface between the substrate 110 and the functional layer 120, are prevented from being etched and enlarged outwardly in the deepening step. Therefore, since the processed groove 150 can be deepened while keeping its high aspect ratio, it is possible to avoid a reduction in the flexural strength of device chips including the respective devices 113 and produced by dividing the wafer 100 along the projected dicing lines 112.

In substrate processing step 1005, according to the present embodiment, the side surface protecting film depositing step and the deepening step are carried out until the processed groove 150 reaches the reverse side 114 of the substrate 110, dividing the wafer 100 along the projected dicing lines 112 into device chips including the respective devices 113. However, the present invention is not limited to the above details of substrate processing step 1005. Rather, after the processed groove 150 has reached the reverse side 114 of the substrate 110, the adhesive tape 131 may be expanded in its plane to divide the wafer 100 along the projected dicing lines 112 into device chips including the respective devices 113.

In the wafer processing method according to the present embodiment that is performed on the wafer 100 including the substrate 110 and the functional layer 120 disposed on the substrate 110, the damaged regions 160 formed in processed groove forming step 1002 are removed in damaged region removing step 1003, and the portions of the functional layer 120 that overhang the recesses 170 formed in damaged region removing step 1003 are removed to expose the recesses 170 upwardly in recess exposing step 1004, after which the processed groove 150 is deepened in substrate processing step 1005. Consequently, the wafer processing method according to the present embodiment is able to prevent the flexural strength of device chips divided from the wafer 100 from being lowered, which flexural strength would otherwise be lowered due to the damaged regions 160. The device chips are also prevented from being unduly deformed due to being partly hollowed by the recesses 170 that would otherwise tend to be etched and enlarged outwardly, and hence have their flexural strength prevented from being lowered. The substrate 110 where the processed groove 150 is deepened without the recesses 170 being enlarged outwardly can be processed easily well.

In the wafer processing method according to the present embodiment, substrate processing step 1005 includes the film depositing process that covers the side surfaces of the recesses 170 from which the damaged regions 160 have been removed and the side surfaces of the processed groove 150 with the side surface protecting film 180 and the plasma etching process that progressively deepens the bottom of the processed groove 150 while preventing the recesses 170 and the processed groove 150 from being enlarged horizontally, i.e., sideways of or outwardly from the recesses 170 and the processed groove 150. The wafer processing method according to the present embodiment is thus capable of deepening the processed groove 150 for a higher aspect ratio.

In the wafer processing method according to the present embodiment, furthermore, recess exposing step 1004 is carried out as a plasma etching process and hence is less apt to adversely affect the substrate 110 including the recesses 170.

The wafer processing method according to the present embodiment includes, before processed groove forming step 1002 is carried out, upper surface protecting film forming step 1001 that forms the upper surface protecting film 140 on the functional layer 120. In processed groove forming step 1002, the portions of the upper surface protecting film 140 and the functional layer 120 are removed. The upper surface protecting film 140 is effective to prevent debris or swarf produced from the functional layer 120 in processed groove forming step 1002 from being deposited on the upper surface of the functional layer 120. In addition, the upper surface protecting film 140 is also effective to prevent the portions of the functional layer 120 that lie on the upper surfaces of the devices 113 from being etched away in subsequent steps of the wafer processing method and hence from adversely affecting the devices 113.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer including a substrate and a functional layer disposed on the substrate along a plurality of projected dicing lines established on the wafer, the method comprising:
    a processed groove forming step of applying a laser beam to the wafer along the projected dicing lines to remove portions of the functional layer, and forming processed grooves in the functional layer through which the substrate is exposed;
    a damaged region removing step of removing damaged regions produced in an interface between the substrate and the functional layer in the processed groove forming step, and forming recesses extending outwardly from side surfaces of the processed grooves;
    a recess exposing step of removing portions of the functional layer that overhang the recesses, thereby exposing the recesses; and
    a substrate processing step of processing the substrate along the projected dicing line after the recess exposing step has been carried out.

2. The method of processing a wafer according to claim 1, wherein the substrate processing step includes covering side surfaces of the recesses from which the damaged regions have been removed and the side surfaces of the processed grooves with side surface protecting films and deepening bottoms of the processed grooves by way of plasma etching while preventing the recesses and the processed grooves from being enlarged horizontally.

3. The method of processing a wafer according to claim 1, wherein the recess exposing step is carried out by way of plasma etching.

4. The method of processing a wafer according to claim 1, further comprising:
    before the processed groove forming step is carried out, an upper surface protecting film forming step of forming an upper surface protecting film on the functional layer, wherein
    the processed groove forming step includes the step of removing portions of the upper surface protecting film and the functional layer.

* * * * *